(12) United States Patent
Jeng et al.

(10) Patent No.: US 6,184,081 B1
(45) Date of Patent: Feb. 6, 2001

(54) METHOD OF FABRICATING A CAPACITOR UNDER BIT LINE DRAM STRUCTURE USING CONTACT HOLE LINERS

(75) Inventors: Erik S. Jeng, Hsinchu; Bi-Ling Chen; Wei-Ray Lin, both of Taipei; Yu-Chun Ho, Pan-Chiao; Ming-Hong Kuo, Ping-Tung, all of (TW)

(73) Assignee: Vanguard International Semiconductor Corporation, Hsin-Chu (TW)

( * ) Notice: Under 35 U.S.C. 154(b), the term of this patent shall be extended for 0 days.

(21) Appl. No.: 09/414,807

(22) Filed: Oct. 8, 1999

(51) Int. Cl.[7] .................................................. H01L 21/336
(52) U.S. Cl. ............................ 438/253; 438/239; 438/254
(58) Field of Search .................................... 438/253, 254, 438/255, 256, 241, 396, 397, 398, 399, 239

(56) References Cited

U.S. PATENT DOCUMENTS

| | | | |
|---|---|---|---|
| 5,322,438 | 6/1994 | McNutt et al. | 716/8 |
| 5,648,291 | 7/1997 | Sung | 438/396 |
| 5,681,773 | 10/1997 | Tseng | 438/599 |
| 5,780,333 | 7/1998 | Kim | 438/238 |
| 5,780,339 | 7/1998 | Liu et al. | 438/253 |
| 5,804,852 | 9/1998 | Yang et al. | 257/308 |
| 5,895,239 * | 4/1999 | Jeng et al. | 438/254 |
| 5,918,120 * | 6/1999 | Huang | 438/239 |
| 5,956,594 * | 9/1999 | Yang et al. | 438/256 |
| 6,022,776 * | 2/2000 | Lien et al. | 438/253 |
| 6,028,360 * | 2/2000 | Nakamura et al. | 257/758 |
| 6,074,908 * | 6/2000 | Huang | 438/239 |
| 6,077,742 * | 6/2000 | Chen et al. | 438/255 |

* cited by examiner

Primary Examiner—Michael Trinh
(74) Attorney, Agent, or Firm—George O. Saile; Stephen B. Ackerman (57) ABSTRACT

A process for fabricating a DRAM capacitor structure, in which the capacitor upper plate structure is defined during the formation of bit line contact hole opening, and substrate contact hole opening procedure, eliminating the need for a specific upper plate, photolithographic masking procedure, has been developed. The process features isolating a polysilicon upper plate structure, during an isotropic RIE cycle, also creating an undercut polysilicon region, in the contact holes, which are opened simultaneously during the upper plate definition. Subsequent silicon nitride spacers, on the sides of the contact holes, provides insulation between the polysilicon upper plate structure, and bit line, and substrate contact plug structures, now located in the contact holes. The undercut polysilicon regions, allow the formation of thicker silicon nitride spacers, to be formed in this undercut region.

26 Claims, 9 Drawing Sheets

METHOD OF FABRICATING A CAPACITOR UNDER BIT LINE DRAM STRUCTURE USING CONTACT HOLE LINERS

BACKGROUND OF THE INVENTION (1) Field of the Invention

The present invention relates to a process used to fabricate a semiconductor device, and more specifically to a process used to fabricate a capacitor structure, for a random access memory, (DRAM), device.

(2) Description of the Prior Art

To achieve performance requirements for high density DRAM devices, stacked capacitor structures, featuring large surface areas, have been used. Stacked capacitor shapes, such as crown, or cylindrical shaped, structures, have allowed capacitance increases, resulting from increased capacitor surface area, to be realized, without increasing the lateral dimension of the capacitor, or without risking device reliability and yield, by decreasing the already thin, capacitor dielectric layer. However the use of crown, or cylindrical shaped, capacitor structures, arrived at by forming a crown shaped storage node, featuring large vertical shapes, can result in process difficulties when attempting to pattern the upper plate of the capacitor structure. The large vertical shapes, of the crown shaped storage node structure, present photolithographic patterning difficulties, in terms, of step height, critical image control, and mis-alignment.

This invention will describe a process for fabricating a DRAM, stacked capacitor structure, without the use of a specific photolithographic masking procedure, used with conventional processes, to create the capacitor upper plate structure, thus avoiding the difficulties in achieving critical dimension and correct alignment, in addition to the cost reduction realized via the reduction in a critical photolithographic masking step. The elimination of the upper plate, photolithographic procedure, is accomplished using a novel process sequence in the capacitor upper plate definition is achieved simultaneously with contact hole openings, made for bit line, capacitor, and substrate contact purposes, using one photolithographic mask, and using the same etching steps. The definition of the capacitor upper plate is made in an area in which the topography of a crown, or cylindrical shaped, storage node structure, is not present. The contact holes, opened in the polysilicon layer, used for the capacitor upper plate structure, are then lined with an insulator spacers, providing the necessary insulation between metal plug structures, in the contact holes, and the adjacent polysilicon upper plate structure. This process can be used for capacitor under bit line, (CUB), designs, as well as for capacitor over bit line, (COB), designs. Prior art, such as Yang et al, in U.S. Pat. No. 5,804,852, as well as Sun, in U.S. Pat. No. 5,648,291, show processes for creating capacitor under bit line structures, however these prior arts do not show the novel procedures, used in the present invention, such as the definition of the capacitor upper plate structure, during contact hole opening procedures.

SUMMARY OF THE INVENTION

It is an object of this invention to create a capacitor structure, for a DRAM device.

It is another object of this invention to define the capacitor upper plate structure, simultaneously with the opening of bit line, and substrate, contact hole openings, using the same photolithographic mask and dry etching procedures.

It is still another object of this invention to use insulator spacers on the sides of contact holes, to provide the needed insulation between metal plug structures, in the contact holes, and the adjacent capacitor upper plate structure.

In accordance with the present invention a method of fabricating a DRAM capacitor structure, featuring a capacitor upper plate structure, defined simultaneously with the creation of bit line, and substrate, contact hole openings, and featuring insulator spacers on the sides of the contact holes, is described. Polysilicon plug structures are formed in self-aligned contact openings, in an insulator layer, contacting source/drain regions, that are in turn located in a region of a semiconductor substrate, between polycide gate structures. Capacitor openings are next formed in a thick silicon oxide, thin silicon nitride, composite layer: with a first capacitor opening exposing the top surface of a polysilicon contact plug, used for capacitor contact purposes, and a second opening exposing an underlying insulator layer. Crown shaped, or cylindrical shaped, storage node structures are formed in the capacitor openings via deposition of the storage node conductive material, followed by removal of the storage node conductive material, from the top surface of the silicon oxide silicon nitride composite layer, resulting in the vertical features, of the storage node conductive material, on the sides of the capacitor openings, connected by a horizontal feature, of storage node conductive material, located at the bottom of the capacitor opening, contacting an underlying polysilicon plug, at the bottom of the first capacitor opening. After removal of the silicon oxide layer, of the composite insulator layer, a capacitor dielectric layer is formed, followed by the deposition of the polysilicon layer, to be used for the capacitor upper plate structure, with this polysilicon layer completely filling the narrow space between the two capacitor openings. The capacitor openings now contain a crown shaped storage node structure, located on the inside surfaces of the opening, and a polysilicon layer overlying the crown shaped storage node structure, with the capacitor dielectric layer located between these conductive layers.

After deposition of an insulator layer, contact holes are formed in a series of layers, including through the polysilicon layer, used for the capacitor upper plate structure. The same photolithographic mask, and dry etching procedures, used to create the contact holes, also allow definition, or isolation of a polysilicon shape, to be used as the capacitor upper plate shape. A first contact hole opening, exposes the top surface of a polysilicon plug, to be used for bit line contact, while a second contact opening, used for substrate contact, exposes a portion of the semiconductor substrate. A third contact opening, exposes a portion of the polysilicon layer, located in the space between filled, capacitor openings. The contact opening, and capacitor upper plate definition procedure also features an isotropic cycle used for the polysilicon layer, to intentionally create an undercut polysilicon region, in the contact holes. Silicon nitride spacers are next formed on the sides of all contact holes, including a thicker spacer, located in undercut polysilicon regions of the contact hole. Metal plug structures are formed in the contact holes, followed by the formation of overlying metal interconnect structures. The crown shaped, DRAM capacitor structure, now offers increased surface area as a result of an upper capacitor plate, defined during the contact hole opening procedure, now overlying two crown shaped storage node structures, each residing in a capacitor opening.

BRIEF DESCRIPTION OF THE DRAWINGS

The object and other advantages of this invention are best described in the preferred embodiments, with reference to the attached drawing which include.

DESCRIPTION OF THE PREFERRED EMBODIMENTS

The process for fabricating a DRAM capacitor structure, featuring the simultaneous definition of a capacitor upper plate structure, and contact holes, lined with insulator spacers, to specific regions of the DRAM device, will now be described in detail. A P type, semiconductor substrate 1, comprised of single crystalline silicon, with a <100> crystallographic orientation is used. Isolation regions 2, either thermally grown silicon dioxide, field oxide, (FOX), regions, or insulator filled, shallow trench isolation, (STI), regions, are formed in semiconductor substrate 1, to a thickness between about 2000 to 4000 Angstroms. Polycide gate structures 8–12, comprised of metal silicide layer 5, such as tungsten silicide, at a thickness between about 500 to 1500 Angstroms, on underlying polysilicon layer 4, with polysilicon layer 4, in situ doped, and at a thickness between about 500 to 1500 Angstroms. Polycide gate structures 8–12, are encapsulated with silicon nitride, capping layer 6, at a thickness between about 1500 to 3000 Angstroms, and by silicon nitride spacers 7, at a thickness between about 200 to 600 Angstroms. Silicon nitride encapsulated, polycide gate structures 8–12, schematically shown in FIG. 1, reside on silicon dioxide gate insulator layer 3, which was thermally grown, in an oxygen-steam ambient, to a thickness between about 40 to 80 Angstroms.

Figure 1:
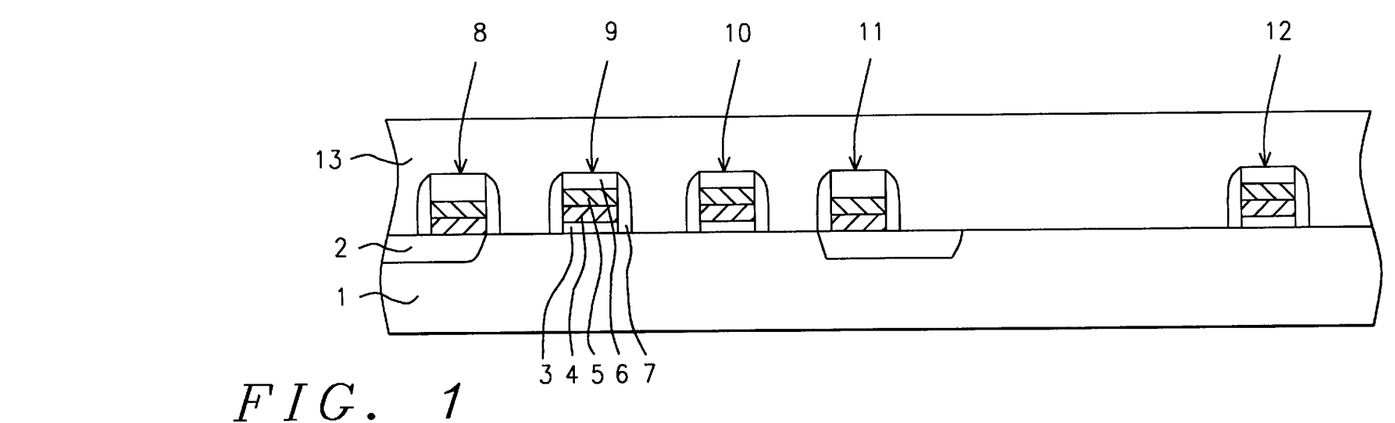
FIGS. 1–10, which schematically, in cross-sectional style, show the key stages of fabrication used to create a DRAM capacitor structure, featuring an upper plate structure, defined simultaneously with the formation of bit line, and substrate contact hole openings.

Lightly doped source/drain regions, (not shown in drawings), are formed via ion implantation procedures, prior to the formation of silicon nitride spacers 7, in areas of semiconductor substrate 1, not covered by the polycide gate structures, while heavily doped source/drain regions, (not shown in the drawings), are also formed via ion implantation procedures, after formation of silicon nitride spacers 7. The source/drain regions can be N type, or P type regions. Silicon oxide layer 13, shown schematically in FIG. 1, is next deposited via low pressure chemical vapor deposition, (LPCVD), or plasma enhanced chemical vapor deposition, (PECVD), procedures, to a thickness between about 5000 to 10000 Angstroms, followed by a chemical mechanical polishing, (CMP), procedure, used to create a smooth top surface topography for silicon oxide layer 13.

Figure 2:
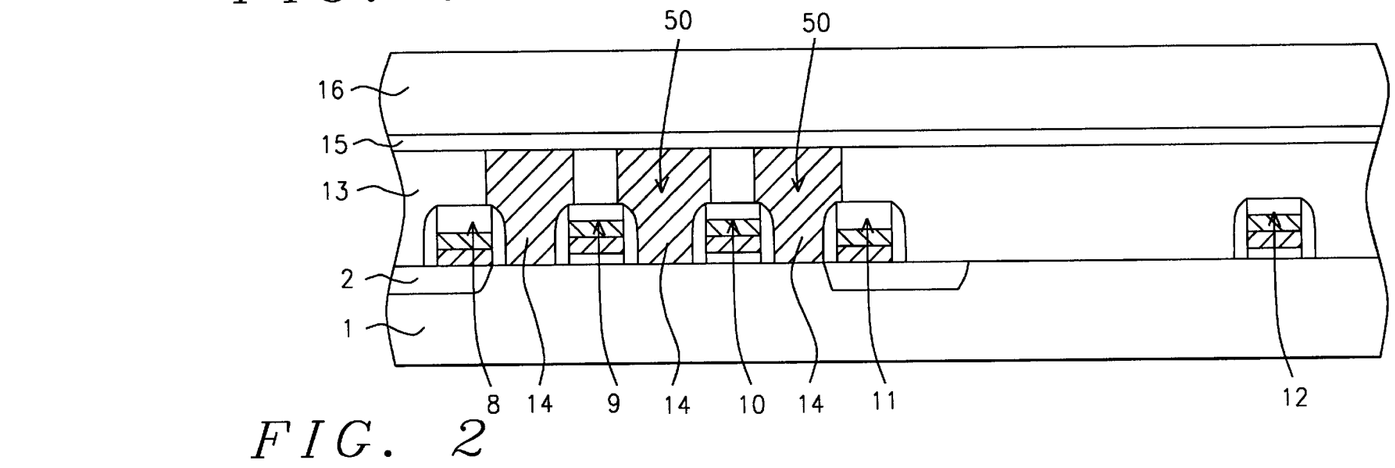

Photolithographic and selective, anisotropic, reactive ion etching, (RIE), procedures, using $C_4F_8/CO$ as an etchant, are used to create self-aligned contact, (SAC), openings 50, in silicon oxide layer 13, shown schematically in FIG. 2. The opening in the SAC photolithographic mask is wider than the space between silicon nitride encapsulated polycide gate structures, resulting in exposure of the entire width of the source/drain regions. This is accomplished via the selectivity of the RIE procedure, in which the removal rate of silicon oxide, using $CHF_3$ as an etchant, is greater than the removal rate of silicon nitride. After removal of the photoresist shape, used for definition of SAC openings 50, via plasma oxygen ashing and careful wet cleans, polysilicon plugs 14, are formed via deposition of an N type, in situ doped, polysilicon layer, via LPCVD procedures, at a thickness between about 3000 to 5000 Angstroms, using silane, with the addition of arsine or phosphine to provide the N type dopants, followed by the removal of unwanted polysilicon, from the top surface of silicon oxide layer 13, via a CMP procedure, or via a selective RIE procedure, using $Cl_2$ as an etchant. A silicon nitride layer 15, or a silicon oxynitride layer, is next deposited, via LPCVD or PECVD procedures, to a thickness between about 300 to 1000 Angstroms, followed by the deposition of a thick silicon oxide layer 16, via LPCVD or PECVD procedures, to a thickness between about 8000 to 12000 Angstroms. The result of these procedures is schematically shown in FIG. 2.

Figure 3:
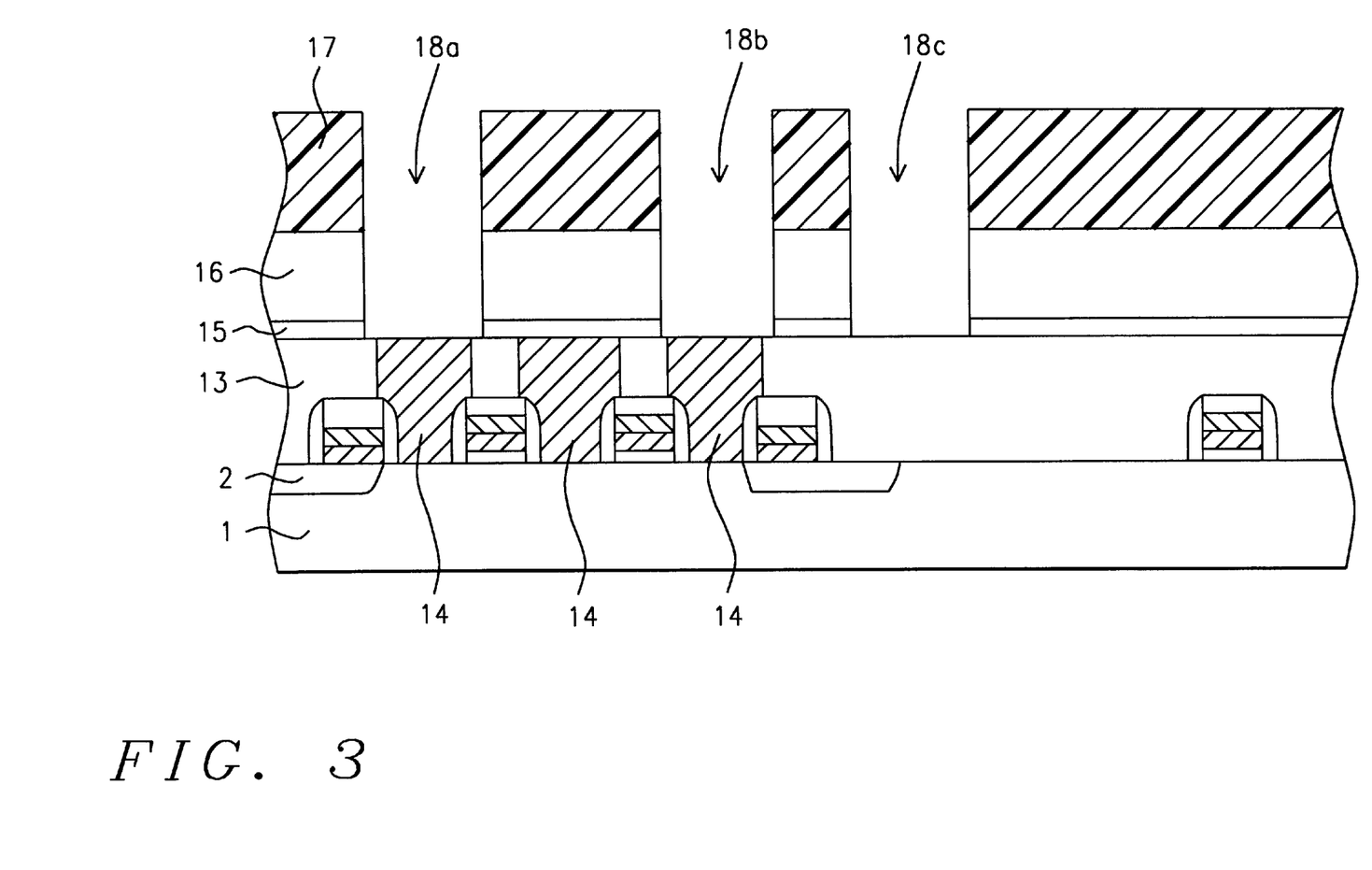

Photoresist shape 17, is used as a mask to allow an anisotropic RIE procedure, using $C_4F_8/CO$ as an etchant for thick silicon oxide layer 16, and $CF_4/CHF_3$ as an etchant for silicon nitride layer 15, to create capacitor node openings 18a, 18b, and 18c, shown schematically in FIG. 3. Subsequent storage node structures residing in capacitor node opening 18b, and 18c, will be combined via the novel upper plate definition procedure, described in this invention, to result in the desired increased capacitor surface area. Capacitor node opening 18b, exposes the top surface of a polysilicon plug 14, to be used for communication between the subsequent capacitor structure, and an underlying source/drain region.

Figure 4:
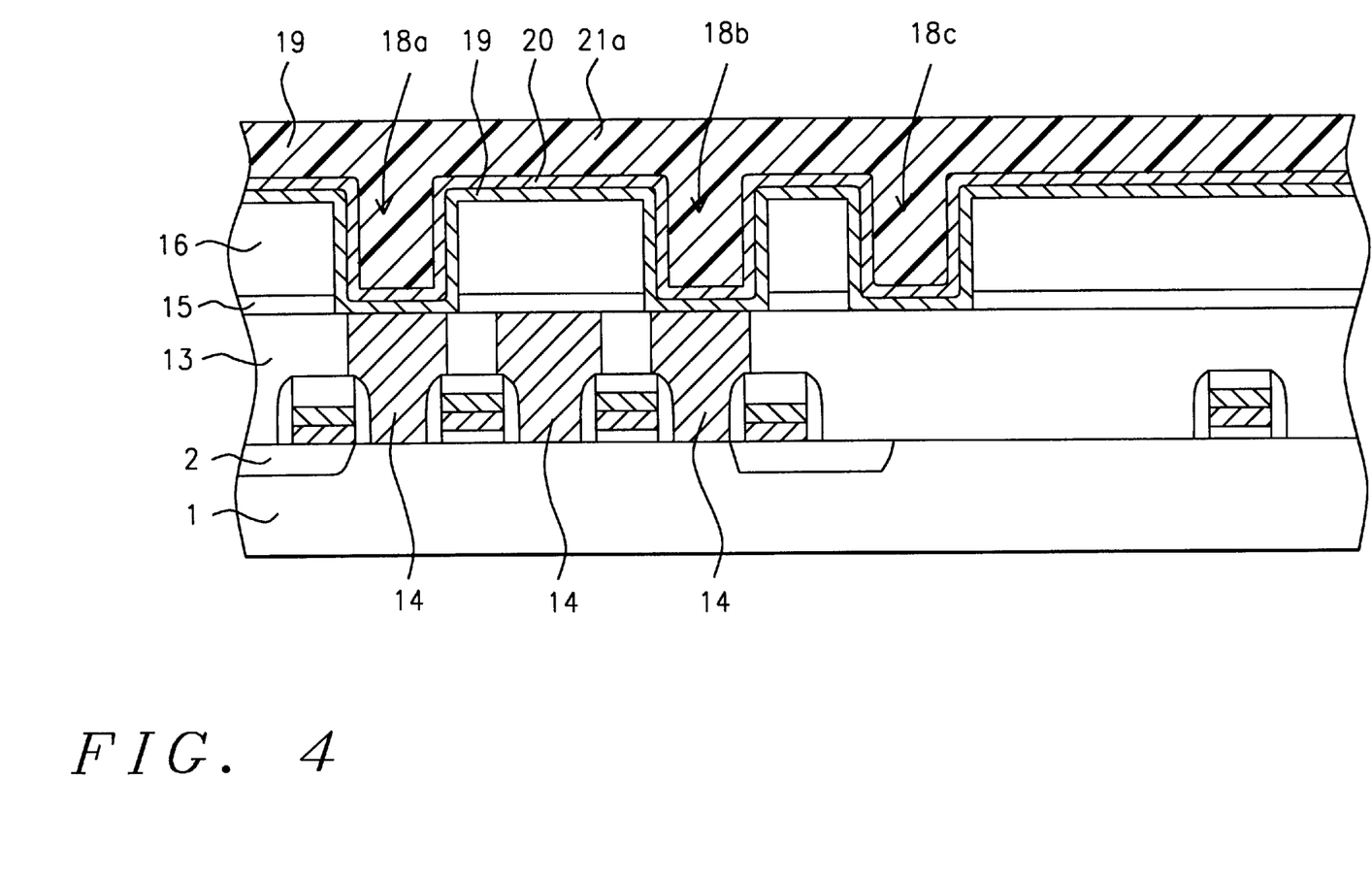

After removal of photoresist shape 17, via plasma oxygen ashing and careful wet cleans, the formation of the crown shaped, or cylindrical shaped, lower electrode, or storage node structure, of the DRAM capacitor, is addressed. An in situ doped polysilicon layer 19, is deposited via LPCVD procedures, at a thickness between about 100 to 1000 Angstroms, conformally coating the surfaces of the capacitor node openings, as well as residing on the top surface of thick silicon oxide layer 16. Polysilicon layer 19, is lightly doped, during the in situ deposition, via the addition of arsine or phosphine to a silane, ambient, resulting in a dopant concentration for polysilicon layer 19, between about 1E19 to 1E20 atoms/$cm^3$. Next a conductive layer 20, such as either an in situ doped polysilicon layer, a tungsten layer, or a titanium titanium nitride layer, is deposited, to a thickness between about 500 to 1500 Angstroms, overlying in situ doped polysilicon layer 19, however not completely filling the capacitor node openings. If an in situ doped polysilicon layer, is used for layer 20, LPCVD procedures are used, again adding arsine or phosphine, to a silane ambient, to result in a dopant concentration between about 1E20 to 1E22 atoms/$cm^3$. Tungsten, if used for layer 20, is obtained via LPCVD procedures, whereas the titanium titanium nitride option is obtained chemical vapor deposition, (CVD), procedures. A photoresist layer 21a, is next formed, completely filling the capacitor node openings. This is schematically shown in FIG. 4.

Figure 5:
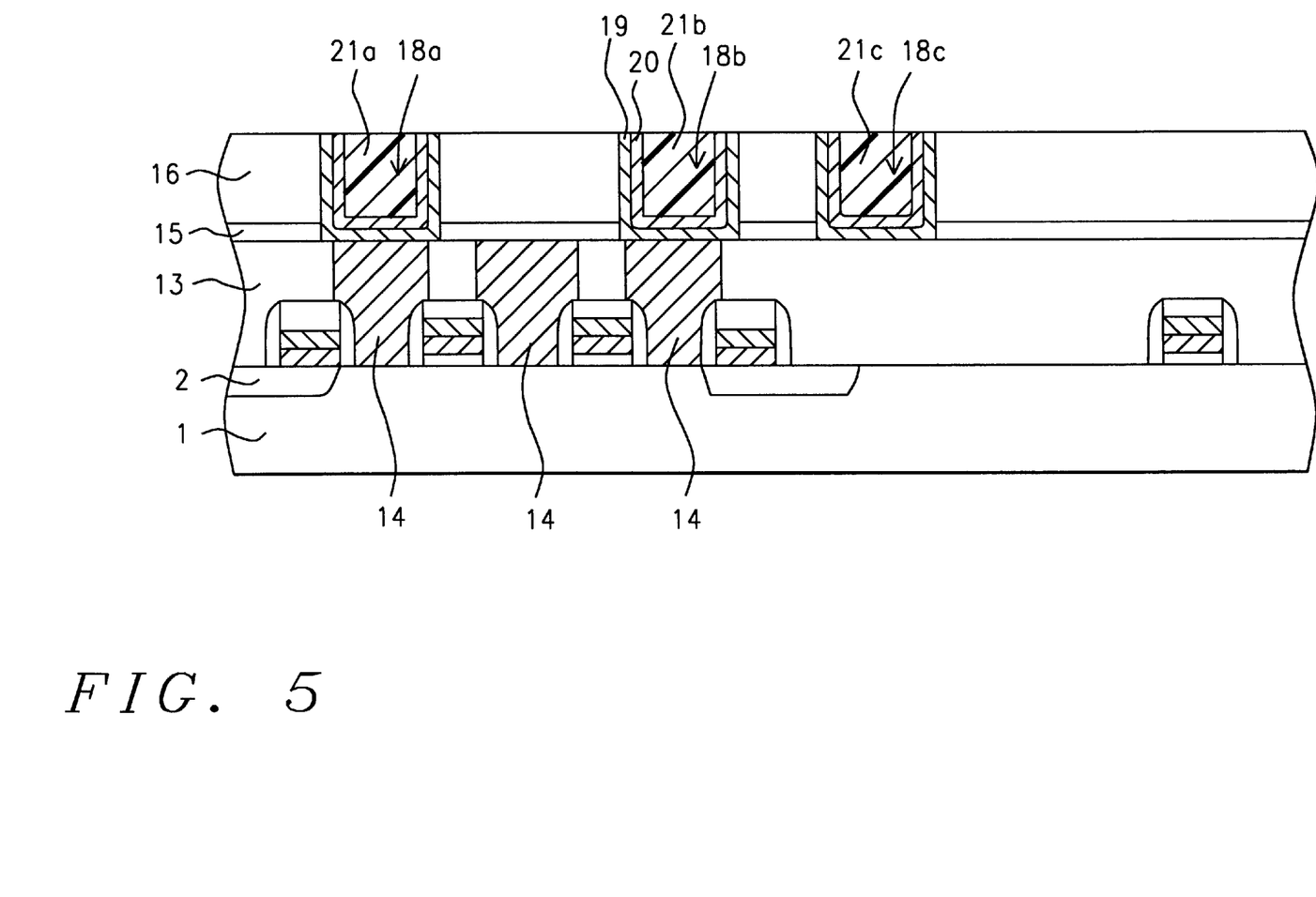

An oxygen RIE procedure is next employed to etch back photoresist layer 21a, to a point in which the region of the storage node composite layer, comprised of conductive layer 20, on polysilicon layer 19, residing on the top surface of thick silicon oxide layer 16, is exposed. Selective removal of the exposed region of the storage node composite layer, residing on the top surface of silicon oxide layer 16, is accomplished using either a CMP procedure, or a RIE procedure, using $Cl_2$ as an etchant, creating individual storage node structures, comprised of the composite layer, in each capacitor node opening. The storage node structures, located on the surface of the capacitor node openings, were protected during the CMP or RIE procedure, by photoresist plugs 21a–21c, created by the oxygen RIE, photoresist etch back procedure. The result of these procedures are schematically shown in FIG. 5.

Figure 6:
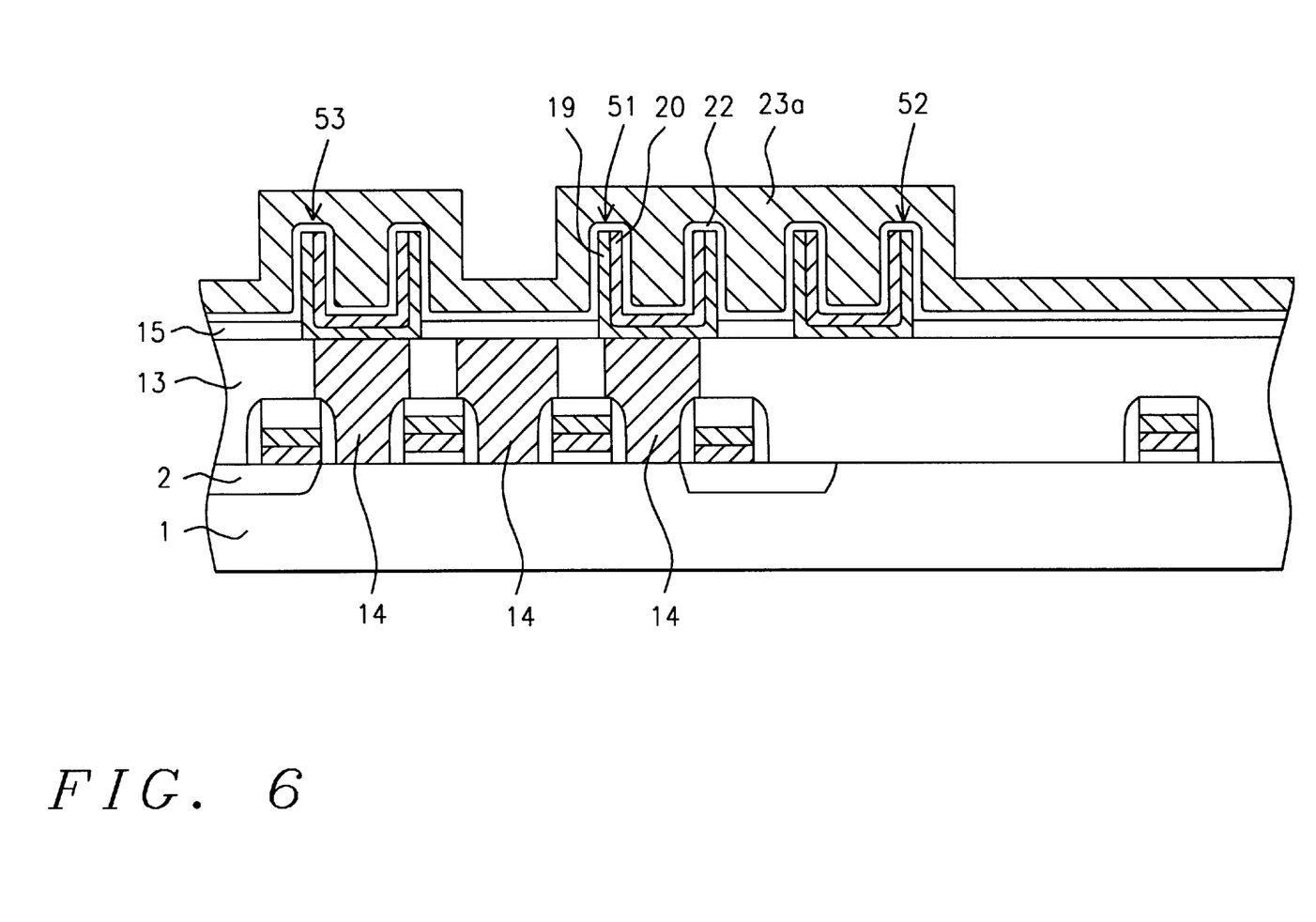

After removal of photoresist plugs 21a, 21b, and 21c, using plasma oxygen ashing and careful wet cleans, thick silicon oxide layer 16, is selectively removed using either a wet buffered hydrofluoric acid solution, or via use of a hydrofluoric acid vapor etch. This procedure results in the storage node structure 51, shown schematically in FIG. 6, overlying and contacting polysilicon plug 14, and adjacent storage node structure 52, residing on silicon oxide layer 13. The narrow space between storage node structure 51, again comprised of conductive layer 20, on polysilicon layer 19, and storage node structure 52, is only between about 500 to 1000 Angstroms. The wider space between storage node structure 51, and storage node structure 53, to be used for an adjacent capacitor structure, is between about 2500 to 4000 Angstroms. A high dielectric constant layer 22, to be used as the capacitor dielectric layer, for the DRAM capacitor structure, such as either $Ta_2O_5$, oxidized nitride, (NO), or barium zirconium titinate, (BZT), is formed on the storage node structures, at a thickness between about 20 to 100 Angstroms. A polysilicon layer 23a, is next deposited, via LPCVD procedures, to a thickness between about 1000 to 4000 Angstroms, completely filling the narrow space between storage node structure 51, and storage node structure 52. The wider space, between storage node structure 51, and storage node structure 53, remains unfilled. Polysilicon layer 23a, shown schematically in FIG. 6, to be used for the upper plate structure, of the DRAM capacitor structure, is in situ doped, during deposition, via the addition of arsine, or phosphine, to a silane ambient. If desired a titanium nitride layer can be used in place of polysilicon layer 23a.

Figure 7:
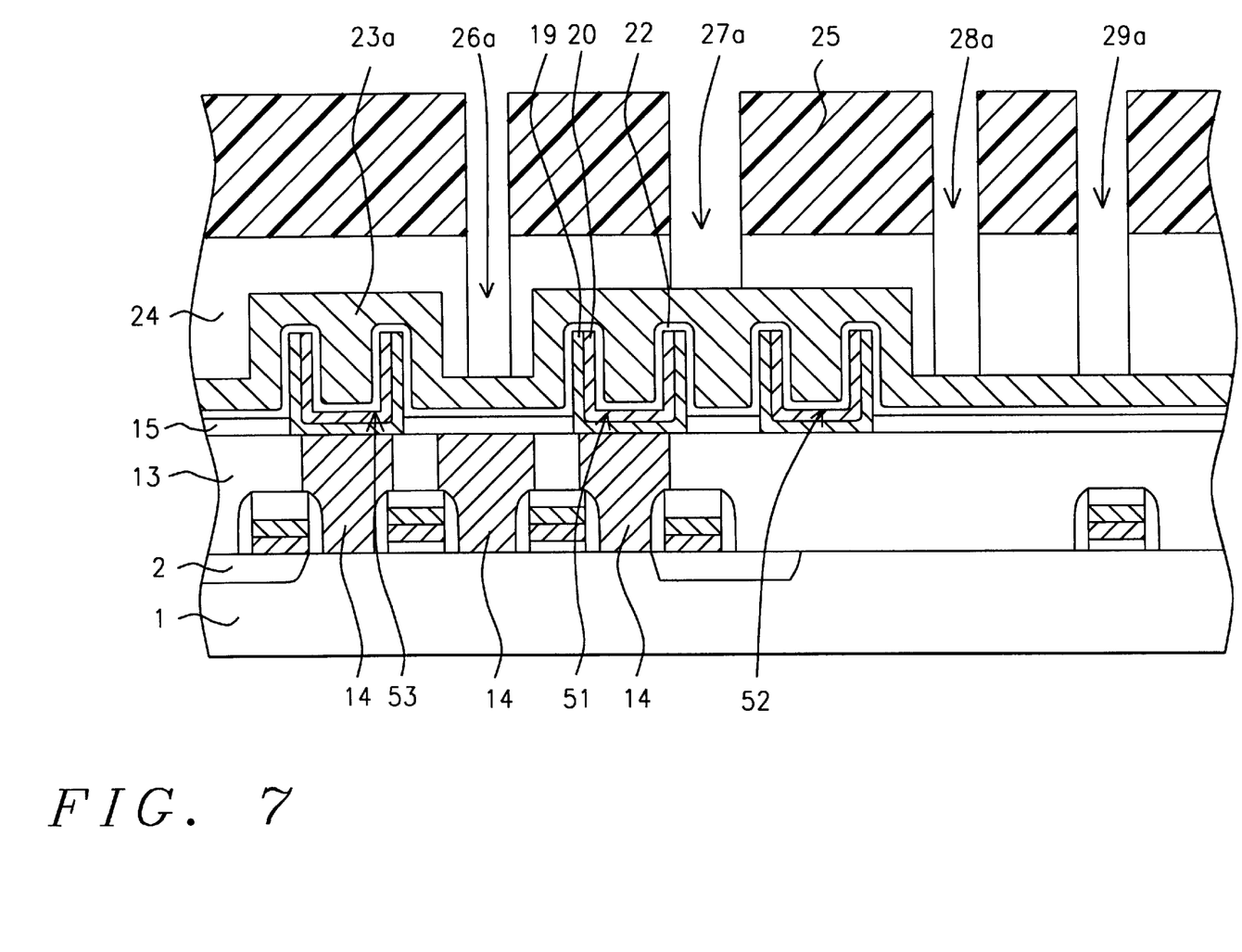
Figure 8:
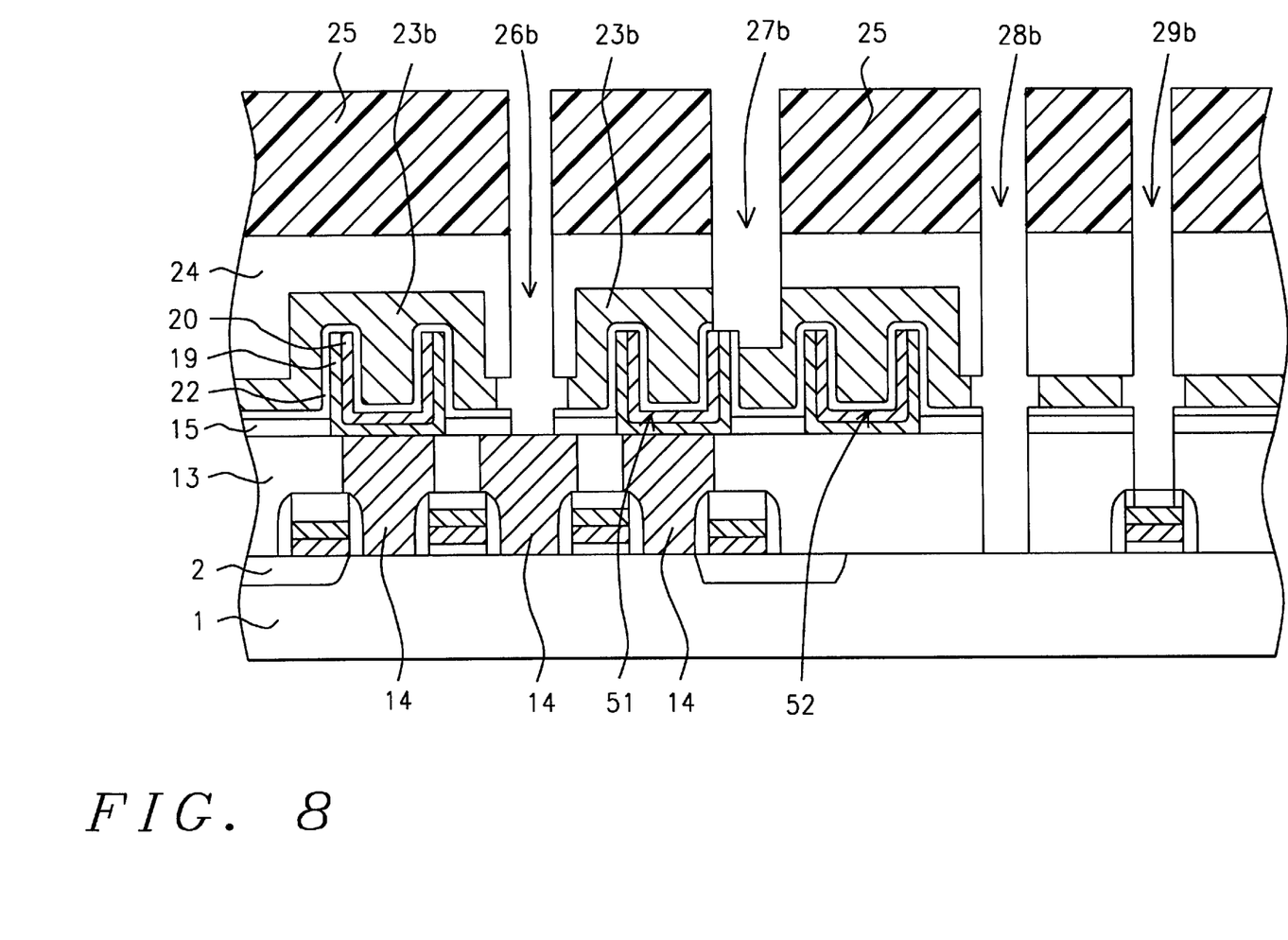

FIGS. 7–8, schematically show the result of contact hole etching procedures, used to create the desired contact hole openings, while simultaneously defining the upper plate structure. First a silicon oxide layer 24, is deposited, via LPCVD or PECVD procedures, at a thickness between about 4000 to 10000 Angstroms, followed by a planarizing CMP procedure, used to create a smooth top surface topography for silicon oxide layer 24 Photoresist shape 25, is then used as a mask to allow a first selective RIE procedure, using $CHF_3$ as an etchant, to create openings 26a, 27a, 28a. and 28a, in silicon oxide layer 24, selectively stopping at the appearance of underlying polysilicon layer 23a. The appearance of polysilicon layer 23a, in contact hole opening 26a, occurs in the wide space between storage node structure 51, and storage node structure 53, and will subsequently be used accommodate the bit line contact structure. Contact hole opening 27a, in silicon oxide layer 24, exposes polysilicon layer 23a, in a region in which the narrow space between storage node structure 51, and storage node structure 52, was completely filled by polysilicon layer 23a. This contact hole opening will be used for the capacitor contact, via use of the upper plate structure. Contact hole openings 28a, and 29a, will subsequently be used for substrate contact, and for word line contact, respectfully. Photoresist shape 25, also features the pattern that allows the desired capacitor upper plate shape, to be defined during the contact hole openings. This feature, not shown in the drawings, defines the capacitor upper plate shape, in a region in which polysilicon layer 23a, resides in wide spaces, between storage node structures. Thus the definition of the capacitor upper plate structure, is defined through the same series of layers used to open substrate contact hole opening 28a. The result of the first phase of the contact hole openings, in silicon oxide layer 24, is schematically shown in FIG. 7.

Via use of the same photoresist shape 25, the second phase of the RIE contact hole procedure, is selectively performed, first using $Cl_2$ as an etchant. The regions of polysilicon layer 23a, exposed in contact hole openings 26a–29a, are selectively removed using wet etch procedures, or using isotropic, plasma/RIE procedures, performed using low R.F. power, and using $Cl_2$ or $SF_6$ as the isotropic etchants. The isotropic polysilicon etch procedure, removes exposed regions of polysilicon layer 23a, resulting in the definition of polysilicon upper plate structure 23b, as well as continuing the contact hole openings, through polysilicon layer 23a. Polysilicon upper plate structure 23b, now overlying both storage node structures 51, and storage node structure 52, thus provides increased capacitor surface area, when compared to counterparts fabricated with only one storage node structure. The isotropic component of this procedure also results in an undercut of polysilicon layer 23b, in the contact holes, which will subsequently provide a space for a thicker, insulating spacer to be formed. After the isotropic polysilicon patterning procedure, a final selective RIE procedure, using CHF, for capacitor dielectric layer 22, and for silicon oxide layer 13, and $CF_4$ as an etchant for silicon nitride layer 15, is employed to finalize definition of bit line contact hole opening 26b, substrate contact hole opening 28b, and word line contact hole opening 29b. In addition contact hole opening 27b, used as contact to polysilicon upper plate structure, is also created, and schematically shown in FIG. 8.

Figure 9:
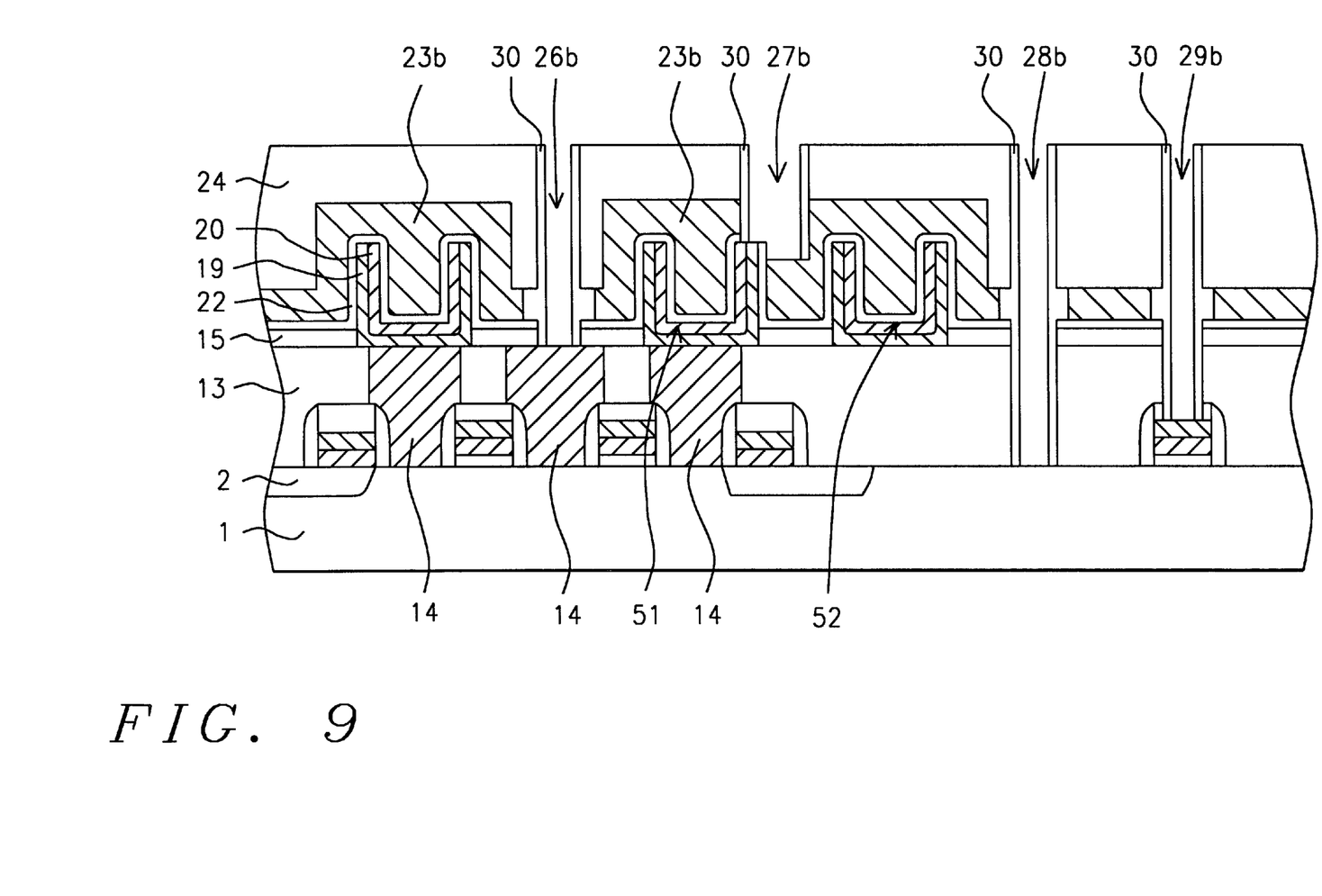

After removal of photoresist shape 25, via plasma oxygen ashing and careful wet cleans, a silicon nitride layer is deposited, using LPCVD or PECVD procedures, at a thickness between about 100 to 1000 Angstroms. The silicon nitride layer fills the undercut regions, of polysilicon shape 23b, exposed in the contact holes, and thus will provide additional insulation between polysilicon shape, or upper plate structure 23b, and subsequent conductive contact structures, formed in the contact holes. An anisotropic RIE procedure, using $CF_4$ as an etchant, is used to remove regions of the silicon, normal to the anisotropic procedure, creating silicon nitride spacers 30, on the sides of contact hole openings 26b–29b, again with a thicker silicon nitride spacer located in the undercut regions, of polysilicon upper plate structure 23b. This is schematically shown in FIG. 9.

Figure 10:
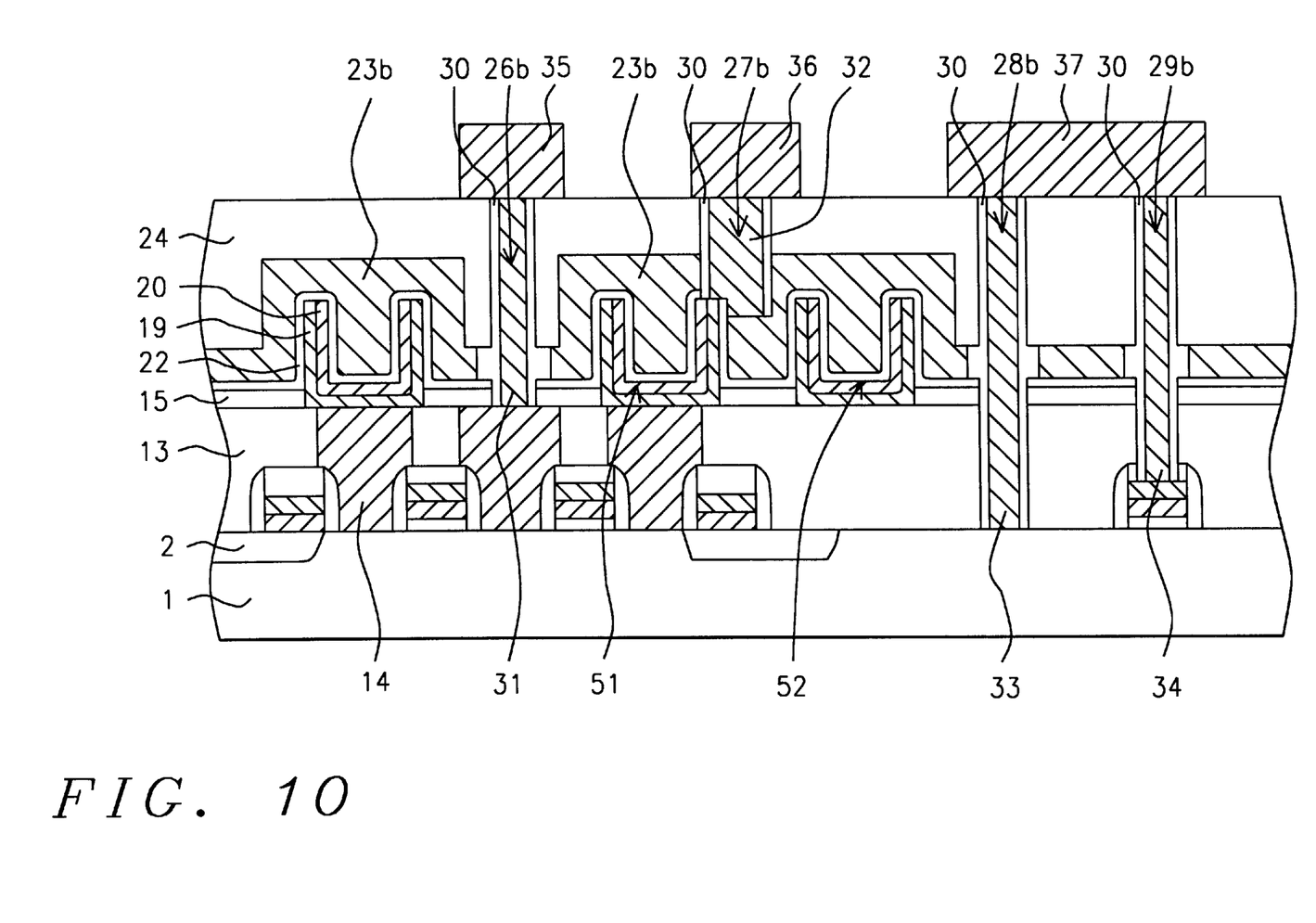

Contact hole openings 26b–29b, are filled with a conductive composite layer, comprised of an adhesive–barrier layer, of titanium—titanium nitride, coating the sides of contact hole openings 26b–29b, and comprised of a tungsten layer, completely filling the contact hole openings. The conductive composite layer is deposited via LPCVD or R.F. sputtering, with unwanted material, residing on the top surface of silicon oxide layer 24, removed via a CMP procedure, or via a selective RIE procedure, using $Cl_2$ as an etchant, creating bit line contact structure 31, in contact hole opening 26b, and substrate contact structure 33, and word line contact structure 34, in contact hole openings 28b and 29b respectfully, shown schematically in FIG. 10. Capacitor contact structure 32, is formed in contact hole opening 27b, allowing contact to polysiliocn upper plate structure 23b, and to the exposed portion of storage node structure 51. Finally overlying metal structures 35, 36, and 37, are formed via deposition of a titanium—aluminum copper titanium nitride, composite layer, via CVD procedures, at a thickness between about 3000 to 10000 Angstroms. Conventional photolithographic and anisotropic RIE procedures, using $Cl_2$ as an etchant, are employed to create metal structures 35, 36, and 37, schematically shown in FIG. 10. The photoresist shape, used for definition of the metal structures, is removed via plasma oxygen ashing and careful wet cleans.

While this invention has been particularly shown and described with reference to, the preferred embodiments thereof, in will be understood by those skilled in the art that various changes in form and details may be made without departing from the spirit or scope of this invention.

What is claimed is:

1. A method of fabricating a capacitor structure for a memory device, on a semiconductor substrate, comprising the steps of:

providing insulator encapsulated gate structures, on a gate insulator layer, on said semiconductor substrate, with source/drain regions, in an area of said semiconductor substrate, not covered by said insulator encapsulated gate structures;

forming self-aligned contact openings, in a first silicon oxide layer, exposing said source/drain regions, located between said silicon encapsulated gate structures;

forming conductive plug structures, in said self-aligned contact openings;

depositing a composite insulator layer, comprised an underlying first silicon nitride layer, and an overlying second silicon oxide layer;

forming capacitor node openings in said composite insulator layer, with a first capacitor node opening, exposing the top surface of a first conductive plug structure, and with a second capacitor node opening exposing a portion of the top surface of said first silicon oxide layer;

forming a first storage node structure, in said first capacitor node opening, overlying and contacting the top surface of said first conductive plug structure, and forming a second storage node structure, in said second capacitor node opening;

forming a capacitor dielectric layer, on said first storage node structure, and on said second storage node structure;

depositing a polysilicon layer, completely filling the space between said first storage node structure, and said second storage node structure;

depositing a third silicon oxide layer;

using a first opening, in a photoresist shape, as an etch mask, to create a first contact hole, in a region not covered by said storage node structures, with said first contact hole formed in said third silicon oxide layer, in said polysilicon layer, in said capacitor dielectric layer, and in said first silicon nitride layer, exposing the top of a second conductive plug structure, with said first contact hole featuring an undercut region, in said polysilicon layer;

using a second opening, in said photoresist shape as an etch mask, to create a second contact hole, in the space between said first storage node structure, and said second storage node structure, with said second contact hole formed in said third silicon oxide layer, and in a top portion of said polysilicon layer, exposing the bottom portion of said polysilicon layer, and in said capacitor dielectric layer, exposing a portion of the top surface of said first storage node structure;

using a third opening, in said photoresist shape, as an etch mask, to create a third contact hole, in a region not covered by said storage node structures, with said third contact hole formed in said third silicon oxide layer, in said polysilicon layer, in said capacitor dielectric layer, in said first silicon nitride layer, and in said first silicon oxide layer, exposing a portion of said semiconductor substrate, with said third contact hole featuring an undercut region, in said polysilicon layer;

using a fourth opening, in said photoresist shape, to define a capacitor upper plate structure, with said capacitor upper plate structure formed in a region not covered by said storage node structures, and formed by the etching of: said third silicon oxide layer; said polysilicon layer; said capacitor dielectric layer; said first silicon nitride layer, and said first silicon oxide layer;

forming silicon nitride spacers on the sides of said first contact hole, on the sides of said second contact hole, and on the sides of said third contact hole, with a thicker silicon nitride spacer formed in the undercut regions of said polysilicon layer, in said first contact hole, and in said third contact hole; and forming a bit line contact structure, in said first contact hole, forming a capacitor contact structure, in said second contact hole, and forming a substrate contact structure, in said third contact hole.

2. The method of claim 1, wherein said conductive plugs, in said self-aligned contact holes, are comprised of polysilicon, obtained via LPCVD procedures, at a thickness between about 3000 to 5000 Angstroms, doped in situ, during deposition via the addition of arsine, of phosphine, to a silane ambient, and patterned via a CMP procedure, or via a selective RIE procedure, using $Cl_2$ as a dopant.

3. The method of claim 1, wherein said composite insulator layer is comprised of an underlying, first silicon nitride layer, obtained via LPCVD or PECVD procedures, at a thickness between about 300 to 1000 Angstroms, and of an overlying second silicon oxide layer, obtained via LPCVD or PECVD procedures, at a thickness between about 8000 to 12000 Angstroms.

4. The method of claim 1, wherein said storage node structures, formed in said capacitor node openings, are comprised of an underlying, lightly doped polysilicon layer, obtained via LPCVD procedures, at a thickness between about 100 to 1000 Angstroms, doped to result in a dopant concentration between about 1E19 to 1E20 atom/$cm^3$, via the addition of arsine or phosphine, to a silane ambient, and comprised of an overlying in situ doped, polysilicon layer, obtained via LPCVD procedures, at a thickness between about 500 to 1500 Angstroms, and doped via the addition of arsine, or phosphine, to a silane ambient, resulting in a dopant concentration between about 1E20 to 1E22 atoms/$cm^3$.

5. The method of claim 1, wherein said space, between said first storage node structure, and said second storage node structure, is between about 500 to 1000 Angstroms.

6. The method of claim 1, wherein said polysilicon layer is obtained via LPCVD procedures, at a thickness between about 1000 to 4000 Angstroms, in situ doped during deposition, via the addition of arsine or phosphine, to a silane ambient.

7. The method of claim 1, wherein said third silicon oxide layer is obtained via LPCVD or PECVD procedures, to a thickness between about 4000 to 10000 Angstroms.

8. The method of claim 1, wherein said first contact hole is formed using said first opening, in said photoresist shape and using an anisotropic RIE procedure, in said third silicon oxide layer, and in said capacitor dielectric layer, using $CHF_3$ as an etchant, and anisotropically in said first silicon nitride layer, using $CF_4$ as an etchant, while said first contact hole is formed in said polysilicon layer using an isotropic RIE procedure, using $Cl_2$ as an etchant.

9. The method of claim 1, wherein said second contact hole is formed using said second opening, in said photoresist shape, using an anisotropic RIE procedure, of said third silicon oxide layer, using $CHF_3$ as an etchant, and using an isotropic RIE procedure, using $Cl_2$ as an etchant, for said polysilicon layer.

10. The method of claim 1, wherein said third contact hole is formed using said third opening, in said photoresist shape, and said capacitor upper plate structure is defined using said fourth opening, in said photoresist shape, using an anisotropic RIE procedure, for said third silicon oxide layer, for said capacitor dielectric layer, and for said first silicon oxide layer, using $CHF_3$ as an etchant, and using $CF_4$ as an etchant for said first silicon nitride layer, while an isotropic RIE procedure, using $Cl_2$, is used for said polysilicon layer.

11. The method of claim 1, wherein said silicon nitride spacers are formed via a deposition of silicon nitride, via LPCVD or PECVD procedures, at a thickness between about 100 to 1000 Angstroms, followed by an anisotropic RIE procedure, using $CF_4$ as an etchant.

12. A method of fabricating a DRAM capacitor structure, on a semiconductor substrate, featuring an upper capacitor plate structure, defined during bit line, capacitor, and substrate contact hole openings, and featuring silicon nitride spacers on the sides of all contact holes, comprising the steps of:

providing silicon nitride capped, polycide gate structures, with silicon nitride sidewall spacers, on an a silicon dioxide gate insulator layer, with source/drain regions located in a region of said semiconductor substrate not covered by said silicon nitride capped, polycide gate structures;

depositing a first silicon oxide layer;

planarizing said first silicon oxide layer;

forming self-aligned contact openings, in said first silicon oxide layer, with each self-aligned contact opening exposing a source/drain region, located between said silicon nitride capped polycide gate structures;

forming a first polysilicon plug structure, in a first self-aligned contact opening, and forming a second polysilicon plug structure, in a second self-aligned contact opening;

depositing a first silicon nitride layer;

depositing a second silicon oxide layer;

forming a first storage node opening, in said second silicon oxide layer, and in said first silicon nitride layer, exposing the top surface said first polysilicon plug structure, and forming a second storage node opening, in said second silicon oxide layer, and in said first silicon nitride layer, exposing a portion of the top surface of said first silicon oxide layer;

forming a first storage node structure, in said first storage node opening, contacting underlying first polysilicon plug structure, and forming a second storage node structure, in said second storage node opening, overlying said first silicon oxide layer, resulting a narrow space between said first storage node structure, and said second storage node structure, exposing a portion of said first silicon nitride layer;

forming a capacitor dielectric layer;

depositing a polysilicon layer;

depositing a third silicon oxide layer;

using a first opening, in a photoresist shape, to form a bit line contact hole opening, in a region not covered by storage node structures, anisotropically in said third silicon oxide layer, isotopically in said polysilicon layer, and anisotropically in said capacitor dielectric layer, and in said first silicon nitride layer, exposing the top surface of a second polysilicon plug structure, and featuring an undercut region, in said polysilicon layer;

using a second opening, in said photoresist shape, to form a capacitor contact hole opening, anisotropically in said third silicon oxide layer, isotopically in a top portion of said polysilicon layer, located in said narrow space, exposing a bottom portion of said polysilicon layer, in said narrow space, and anisotropically in said capacitor dielectric layer, exposing a portion of said first storage node structure;

using a third opening, in said photoresist shape, to form a substrate contact hole opening, in a region not covered by said storage node structures, anisotropically in said third silicon oxide layer, isotopically in said polysilicon layer, creating an undercut region in said polysilicon layer, and anisotropically in said in said capacitor dielectric layer, in said first silicon nitride layer, and in said first silicon oxide layer, exposing a portion of said semiconductor substrate;

using a fourth opening, in said photoresist shape, as an etch mask, to define said upper capacitor plate structure, in a region not covered by said storage node structures, via anisotropic etching of said third silicon oxide layer, isotropic etching of said polysilicon layer, and anisotropic etching of said capacitor dielectric layer, first silicon nitride layer, and of said first silicon oxide layer, creating said DRAM capacitor structure comprised of said upper plate capacitor structure, capacitor dielectric layer, and a lower capacitor plate structure, with said lower capacitor plate comprised of said first storage node structure, and said second storage node structure, connected by said bottom portion of said polysilicon layer, located in said narrow space;

depositing a second silicon nitride layer;

performing an anisotropic dry etching procedure to create silicon nitride spacers on the sides of said bit line contact hole, said capacitor contact hole, and said substrate contact hole, with thick silicon nitride spacers located in undercut regions of said polysilicon layer, in said bit line contact hole, and in said substrate contact hole; and forming a bit line contact plug structure, in said bit line contact hole opening, a capacitor contact plug structure, in said capacitor contact hole opening, and forming a substrate contact plug structure, in said substrate contact hole opening.

13. The method of claim 12, wherein said first polysilicon plug structure, and said second polysilicon plug structure, are formed from a polysilicon layer, obtained via LPCVD procedures, at a thickness between about 3000 to 5000 Angstroms, in situ doped during deposition, via the addition of arsine, or phosphine, to a silane ambient, then patterned via either a CMP procedure, or a selective RIE procedure, using $Cl_2$ as an etchant.

14. The method of claim 12, wherein said first silicon nitride layer is obtained via LPCVD or PECVD procedures, at a thickness between about 300 to 1000 Angstroms.

15. The method of claim 12, wherein said second silicon oxide layer is obtained via LPCVD or PECVD procedures, at a thickness between about 8000 to 12000 Angstroms.

16. The method of claim 12, wherein said first storage node opening, and said second storage node openings, are formed via an anisotropic RIE procedure, using $CHF_3$ as an etchant for said second silicon oxide layer, and using $CF_4$ as an etchant for said first silicon nitride layer.

17. The method of claim 12, wherein said first storage node structure, and said second storage node structure, are comprised of an underlying, lightly doped polysilicon layer, obtained via LPCVD procedures, to a thickness between about 100 to 1000 Angstroms, and in situ doped, during deposition, via the addition of arsine, or phosphine, to a silane ambient, resulting in a dopant concentration between about 1E19 to 1E20 atoms/cm$^3$, and comprised of an overlying polysilicon layer, obtained via LPCVD procedures, to a thickness between about 500 to 1500 Angstroms, and in situ doped during deposition, via the addition of arsine, or phosphine, to a silane ambient, resulting in a dopant concentration between about 1E20 to 2E22 atoms/cm$^3$.

18. The method of claim 12, wherein said narrow space, between said first storage node structure, and said second storage node structure, is between about 500 to 1000 Angstroms.

19. The method of claim 12, wherein said capacitor dielectric layer is chosen from a group that contains, $Ta_2O_5$, NO, or BZT, at a thickness between about 20 to 100 Angstroms.

20. The method of claim 12, wherein said polysilicon layer is obtained via LPCVD procedures, at a thickness between about 1000 to 4000 Angstroms, and in situ doped, during deposition, via the addition of arsine, or phosphine, to a silane ambient.

21. The method of claim 12, wherein said third silicon oxide layer is obtained via LPCVD or PECVD procedures, at a thickness between about 4000 to 10000 Angstroms.

22. The method of claim 12, wherein said bit line contact hole opening, is formed using said first opening, in said photoresist shape, as an etch mask, anisotropically in said third silicon oxide layer, using $CHF_3$ as an etchant, isotopically in said polysilicon layer, using $Cl_2$ as an etchant, anisotropically in said capacitor dielectric layer, using $CHF_3$ as an etchant, and anisotropically in said first silicon nitride layer, using $CF_4$ as an etchant.

23. The method of claim 12, wherein said capacitor contact hole opening is formed using said second opening, in said photoresist shape, as an etch mask, anisotropically in said third silicon oxide layer, using $CHF_3$, and isotopically formed in a top portion of said polysilicon layer, using $Cl_2$ as an etchant.

24. The method of claim 12, wherein said substrate contact hole opening is formed using said third opening, in said photoresist shape, as an etch mask, and said upper capacitor plate structure is formed using said fourth opening, in said photoresist shape, as an etch mask, anisotropically in said third silicon oxide layer, using $CHF_3$ as an etchant, isotopically in said polysilicon layer, using $Cl_2$ as an etchant, anisotropically in said capacitor dielectric layer, and in said first silicon oxide layer, using $CHF_3$ as an etchant, and anisotropically in said first silicon nitride layer, using $CF_4$ as an etchant.

25. The method of claim 12, wherein said second silicon nitride layer is obtained via LPCVD or PECVD procedures, at a thickness between about 100 to 1000 Angstroms.

26. The method of claim 12, wherein said silicon nitride spacers are formed via removal of unwanted regions of said second silicon nitride layer, via an anisotropic RIE procedure, using $CF_4$ as an etchant.

* * * * *